United States Patent
Stuhlfelner

(10) Patent No.: US 10,002,674 B2
(45) Date of Patent: Jun. 19, 2018

(54) METHOD FOR OPERATING A SERIAL NON-VOLATILE SEMICONDUCTOR MEMORY

(71) Applicant: CONTINENTAL AUTOMOTIVE GMBH, Hannover (DE)

(72) Inventor: Friedbert Stuhlfelner, Leiblfing (DE)

(73) Assignee: Continental Automotive GmbH, Hannover (DE)

(*) Notice: Subject to any disclaimer, the term of this patent is extended or adjusted under 35 U.S.C. 154(b) by 0 days. days.

(21) Appl. No.: 15/651,157

(22) Filed: Jul. 17, 2017

(65) Prior Publication Data

US 2018/0019016 A1     Jan. 18, 2018

(30) Foreign Application Priority Data

Jul. 15, 2016 (DE) .................. 10 2016 212 956

(51) Int. Cl.
   *G11C 16/34* (2006.01)
   *G11C 7/10* (2006.01)
(52) U.S. Cl.
   CPC ........ *G11C 16/3418* (2013.01); *G11C 7/1006* (2013.01)
(58) Field of Classification Search
   CPC .................. G11C 16/3418; G11C 7/1006
   USPC ..................................... 365/185.03
   See application file for complete search history.

(56) References Cited

U.S. PATENT DOCUMENTS

| 5,271,709 A | 12/1993 | VanderMeer et al. |
| 5,793,674 A * | 8/1998 | Kubo .......... G06F 11/006 365/185.09 |
| 2006/0023549 A1 | 2/2006 | Son et al. |

* cited by examiner

*Primary Examiner* — Harry W Byrne
(74) *Attorney, Agent, or Firm* — Laurence A. Greenberg; Werner H. Stemer; Ralph E. Locher

(57) ABSTRACT

A method for operating a serial non-volatile semiconductor memory in which, for safely writing data into the semiconductor memory, a serial write sequence is applied to an input terminal. The sequence is formed at least with a sequence of command bits, a sequence of address bits and a sequence of data bytes. During the transmission of the bits of the write sequence, a clock signal is present at a clock input and a sufficiently high supply voltage is present at a supply voltage terminal. On occurrence of a supply voltage that is too low, the write sequence and/or the clock signal is subsequently transmitted incorrectly during the transmission of the write sequence and of the clock signal to the semiconductor memory. In the alternative, the write sequence is not transmitted at all.

3 Claims, 2 Drawing Sheets

METHOD FOR OPERATING A SERIAL NON-VOLATILE SEMICONDUCTOR MEMORY

CROSS-REFERENCE TO RELATED APPLICATION

This application claims the priority, under 35 U.S.C. § 119, of German patent application DE 10 2016 212 956.2, filed Jul. 15, 2016; the prior application is herewith incorporated by reference in its entirety.

BACKGROUND OF THE INVENTION

Field of the Invention

Non-volatile semiconductor memories which, in particular, are designed as EEPROMs or flash EEPROMs are used when data are to remain stored independently of the presence of a supply voltage. In the case of these semiconductor memory types, charge carriers are applied for this purpose to an insulated gate electrode which is at a floating potential (floating gate).

This requires a distinctly higher voltage as the so-called programming voltage than is usually applied from the outside as the supply voltage to the semiconductor chip on which the memory is implemented. The semiconductor memory chip, therefore, has a charge pump which generates the programming voltage from the supply voltage.

If the supply voltage is not high enough, the required programming voltage can frequently no longer be generated, which results in faulty write processes in the semiconductor memory.

In this context, serial EEPROMs and serial flash EEPROMs are semiconductor memories which have a serial data input.

Data corruption due to voltage dips when writing into non-volatile memories is a serious problem in the use of serial EEPROMs and serial flash EEPROMs in motor vehicles. In particular, write accesses frequently occur in the starting and trailing phase of a motor vehicle and it is especially here that the supply voltage situation is critical.

This affects serial SPI (serial peripheral interface), $I^2C$ (Inter IC) and microwire EEPROMS or flash EEPROMS with writing times in the millisecond timing pattern. In particular, the situation is also additionally aggravated by new EEPROM features such as error correction.

Data corruption can lead to increased error entries, increased reset rates, increased field failure rates up to expensive recall actions, particularly when sensitive data domains such as security keys are affected.

For writing data into a serial non-volatile semiconductor memory, a microprocessor in most cases transmits, apart from a chip selection signal and a clock signal, a write sequence to the corresponding inputs of the memory chip.

FIG. 1 shows such a signal sequence with the example of an SPI interface via which the corresponding signals are transmitted to the semiconductor chip. In the case of $I^2C$ and microwire EEPROMs or flash EEPROMs, this is considered as appropriate, however.

The signal sequence of FIG. 1 shows in the first line a Chip Select Signal S or S\, respectively, by means of which the relevant semiconductor chip is determined as addressee of the information on the data line. In the second line, the clock signal C is shown which supplies clock pulses for the duration of the data transmission on the data line. In the third line, the data signal D itself is shown in the form of a write cycle which in the example shown of an SPI write cycle consists of a command section (instruction) in the form of a sequence of command bits, an address section (16-bit address) in the form of a sequence of address bits and a sequence of data bytes. In this context, an arbitrary number of data bytes can be transmitted but, for each data byte, 8 clock pulses must be transmitted in each case on the clock line C so that the data signal is recognized as being correct.

After the transmission of the sequence and decoding in the State Machine of the EEPROM, a sequence of high-voltage pulses is switched to addressed lines and selected columns of the memory matrix within the semiconductor chip. This takes a number of milliseconds and leads to the deletion and subsequent programming of the addressed memory cells.

A voltage dip during this high-voltage sequence lasting some milliseconds (typically >3 ms) can lead to the corruption of the addressed data or of the addressed page in the memory matrix of the EEPROM.

The problem is additionally aggravated by new EEPROM designs with ECC (integrated error correction). The ECC word length here is typically 4 bytes and thus greater than the write granularity of 1 byte. As a result, data corruption effects can occur in the case of write interruption due to a voltage dip which extends beyond the addressed range. In addition, the write sequence is more complex and longer overall due to the ECC algorithm and thus also more endangered with respect to data corruption under low voltage.

SUMMARY OF THE INVENTION

It is accordingly an object of the invention to provide a method for operating a non-volatile serial semiconductor memory which overcomes the above-mentioned and other disadvantages of the heretofore-known devices and methods of this general type and which provides, specifically, for a method for operating an EEPROM in which a data corruption is prevented when a low voltage is present.

With the foregoing and other objects in view there is provided, in accordance with the invention, a method for operating a serial non-volatile semiconductor memory, the method which comprises:

applying a serial write sequence to an input terminal for safely writing data into the semiconductor memory, the write sequence being formed at least with a sequence of command bits, a sequence of address bits and a sequence of data bytes;

during a transmission of the bits of the write sequence, applying a clock signal at a clock input;

supplying a supply voltage at a sufficient voltage level at a supply voltage terminal; and on occasion of a low supply voltage, subsequently transmitting at least one of the write sequence or the clock sequence incorrectly during the transmission of the write sequence and of the clock signal to the semiconductor memory.

In other words, in a method for operating a serial non-volatile semiconductor memory in which, for safely writing data into the semiconductor memory, a serial write sequence is applied to an input terminal, which sequence is formed at least with a sequence of command bits, a sequence of address bits and a sequence of data bytes, wherein, during the transmission of the bits of the write sequence, a clock signal is present at a clock input and a sufficiently high supply voltage is required at a supply voltage terminal, in the case of the occurrence of too low a supply voltage, the write sequence and/or the clock signal is subsequently transmitted incorrectly during the transmission of the write sequence and of the clock signal to the semiconductor memory.

The terms "sufficient voltage" or "sufficient supply voltage" as used herein means that a voltage level is present at the supply terminal that enables the device to safely write the entire sequence. The terms "low voltage" or "low supply voltage" as used herein means that the voltage level is insufficient and that, on continued writing, data corruption would/might occur.

When there is information that the supply voltage is too low, that is to say a low voltage is present, it can thus be achieved by manipulation of the write command that the State Machine of the EEPROM decodes the write command as invalid and aborts. This can happen in various ways.

In an advantageous development of the invention, this manipulation occurs by adding 1 to 7 additional SPI clock pulses before the deactivation of the Chip Select Signal.

This ensures that a write sequence which is currently transmitted is aborted at the earliest possible time after the activation of a low-voltage signal.

A low-voltage signal for the supply voltage is present in current control devices for motor vehicles typically in the form of an interrupt for initiating a housekeeping phase in the microcontroller.

By means of such a manipulation according to the invention of the signals or of a signal of the write process, a write process already initiated can ultimately be prevented in a simple but effective manner although the set of commands of EEPROMs does not have an explicit abort command.

With the above and other objects in view there is also provided, in accordance with the invention, a method for operating a serial non-volatile semiconductor memory, the method which comprises:

applying a serial write sequence to an input terminal for safely writing data into the semiconductor memory, the write sequence being formed at least with a sequence of command bits, a sequence of address bits and a sequence of data bytes;

during a transmission of the bits of the write sequence, applying a clock signal at a clock input;

supplying a supply voltage at a supply voltage terminal; and if a low voltage is present, not transmitting a write sequence to the semiconductor memory.

In other words, if no write process has yet been initiated, a data corruption can be prevented in another embodiment of the invention in that, in the case of too low a supply voltage being present, there is no transmission of a write sequence to the semiconductor memory.

The signal which indicates a low voltage is thus used for preventing the beginning of a write process.

Other features which are considered as characteristic for the invention are set forth in the appended claims.

Although the invention is illustrated and described herein as embodied in a method for operating a serial non-volatile semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
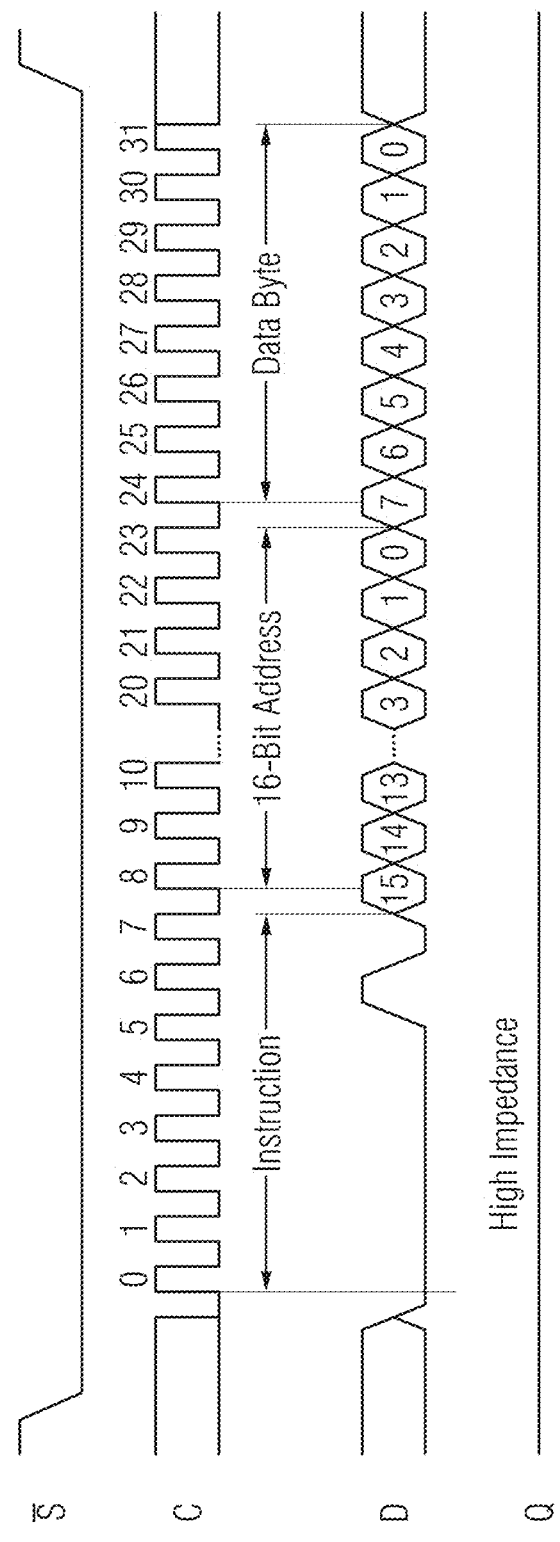
FIG. 1 shows the course of write signals with an EEPROM having an SPI interface according to the prior art.
Figure 2:
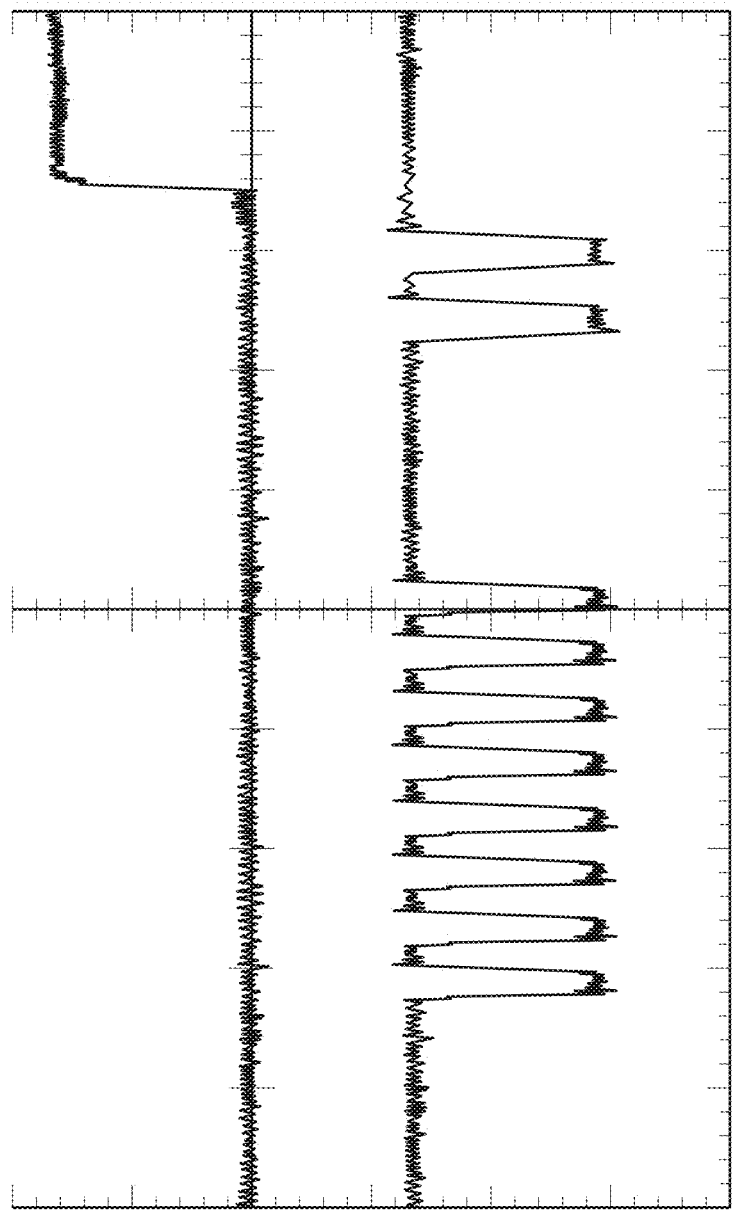
FIG. 2 shows the course of a Chip Select Signal and the course according to the invention of a clock signal.

Referring now once more to the figures of the drawing in detail and particularly to FIG. 2 thereof, the signal shape shown in the lower part of the figure shows clock pulses of a clock signal by means of which the bits of the command, address and data signals are clocked into an EEPROM. During a valid Chip Select Signal as shown by the signal shape shown in the upper part of the figure, clock signals for the data bytes have to comprise eight clock pulses or a multiple thereof, however, in order to be recognized as valid by the State Machine of the EEPROM.

In the example shown, finally, two clock pulses are transmitted again, whereupon the State Machine discards the entire write sequence as invalid and does not initiate any programming pulses.

By means of this manipulation of the clock signal, programming of the data bytes can thus be prevented effectively even with a write sequence which has already started, when a low voltage is present.

The invention claimed is:

1. A method for operating a serial non-volatile semiconductor memory, the method which comprises:

applying a serial write sequence to an input terminal for safely writing data into the semiconductor memory, the write sequence being formed at least with a sequence of command bits, a sequence of address bits and a sequence of data bytes;

during a transmission of the bits of the write sequence, applying a clock signal at a clock input;

supplying a supply voltage at a supply voltage terminal; and on occasion of a low supply voltage, subsequently transmitting at least one of the write sequence or the clock sequence incorrectly during the transmission of the write sequence and of the clock signal to the semiconductor memory.

2. The method according to claim 1, which comprises, subsequently to transmitting a last data byte of the write sequence, transmitting a sequence of clock signal pulses having a number of at least 1 and at most 7.

3. A method for operating a serial non-volatile semiconductor memory, the method which comprises:

applying a serial write sequence to an input terminal for safely writing data into the semiconductor memory, the write sequence being formed at least with a sequence of command bits, a sequence of address bits and a sequence of data bytes;

during a transmission of the bits of the write sequence, applying a clock signal at a clock input;

supplying a supply voltage at a supply voltage terminal; and if a low voltage is present, not transmitting a write sequence to the semiconductor memory.

* * * * *